United States Patent [19]

Subrahmanyan et al.

[11] Patent Number: 5,459,083
[45] Date of Patent: Oct. 17, 1995

[54] METHOD FOR MAKING BIMOS DEVICE HAVING A BIPOLAR TRANSISTOR AND A MOS TRIGGERING TRANSISTOR

[75] Inventors: Ravi Subrahmanyan; Howard C. Kirsch, both of Austin, Tex.

[73] Assignee: Motorola, Inc., Schaumburg, Ill.

[21] Appl. No.: 24,719

[22] Filed: Mar. 1, 1993

[51] Int. Cl.[6] .................................................. H01L 21/265
[52] U.S. Cl. .................. 437/31; 437/6; 437/59; 437/61; 437/63; 437/64; 148/DIG. 9; 257/141; 257/370; 257/378
[58] Field of Search ................................. 437/59, 6, 61, 437/63, 64, 31; 148/DIG. 9; 257/141, 370, 378

[56] References Cited

U.S. PATENT DOCUMENTS

| | | | |
|---|---|---|---|
| 4,353,085 | 10/1982 | Sakurai | 257/377 |
| 4,697,199 | 9/1987 | De Graaff et al. | |
| 4,786,958 | 11/1988 | Bhagat | |
| 4,971,921 | 11/1990 | Fukunaga et al. | |
| 5,043,782 | 8/1991 | Avery | |
| 5,124,271 | 6/1992 | Havemann | 437/59 |

OTHER PUBLICATIONS

"Lateral Junction—Isolated Emitter Switched Thyrister", B. Joyant Baliga et al., IEEE EDL vol. 13, No. 12, Dec. 1992.
"Investigation of . . . With a Buried Drain", Marius Orlowski, IEEE, 1992.
"Snap–Back . . . " A. Ochoa et al. MOS–Controlled Thyristors . . . , Victor Temple, IE[3] To Ed, ED–33. No. 10. Oct. 1986.
"The Insulated Gate . . . Power Device", Baliga et al., IE[3] TOED, vol. ED–31, No. 6 Jun. 1984.

Orlowski, et al.; "Investigation of SOI–Like I–V Characteristics for a 64–Mb Dram SCC MOSFET with a Buried Drain", IEEE Trans. on Electron Devices; vol. 39, No. 7, pp. 1652–1660 (Jul. 1992).
Ochoa, et al.; "Snap–Back:A Stable Regenerative Breakdown Mode of MOS Devices", Sandia Nat'l Lab., Contract No. DE–ACO4–76DP00789 (1983).
Victor A. K. Temple; "MOS–Conrolled Thyristors–A New Class of Power Devices"; IEEE Trans. on Elecron Devices; vol. ED–33, No. 10, pp. 1609–1618 (1986).
Baliga, et al.; "The Insulated Gate Transistor: A New Three–Terminal MOS Controlled Bipolar Power Device", IEEE Trans. on Electron Devices; vol. ED–31, No. 6, pp. 821–828 (1984).

Primary Examiner—Olik Chaudhuri
Assistant Examiner—Long Pham
Attorney, Agent, or Firm—George R. Meyer

[57] ABSTRACT

The present invention includes a BiMOS device having an MOS transistor that triggers a bipolar transistor, wherein the base and channel region are formed within a well region that electrically floats. The present invention also includes a BiMOS device having separate regions for the collector and drain regions and for the base and channel regions. The present invention further includes processes for forming the BiMOS devices. The BiMOS device may include a floating well region. The BiMOS device may include both low voltage MOS logic transistors and a high voltage or high power bipolar transistor. A low voltage or low power bipolar transistor may also be used. Separate drain, collector, base, and channel regions allow the bipolar transistor performance to be optimized independently of the MOS transistor, which may have its performance independently optimized, too. A plurality of MOS logic transistors, such as an AND or an OR gate may be used in the BiMOS device.

19 Claims, 9 Drawing Sheets

METHOD FOR MAKING BIMOS DEVICE HAVING A BIPOLAR TRANSISTOR AND A MOS TRIGGERING TRANSISTOR

FIELD OF THE INVENTION

The present invention relates to the field of semiconductor devices, and in particular, to a BiMOS device having a bipolar transistor and a field-effect triggering transistor.

BACKGROUND OF THE INVENTION

BiMOS devices that include a bipolar transistor and a metal-oxide-semiconductor field-effect transistor (MOS transistor) as a trigger for the bipolar transistor have been used for years. In many of these devices, the bipolar transistor, which is part of a pnpn thyristor, and the MOS transistor share the same regions, or the source and drain of the triggering MOS transistor are connected to the p-type regions or the n-type regions of the thyristor. In the former, the collector and drain are part of the same region, the base and channel region are part of the same region, and the emitter and source are part of the same region. In this case, both the bipolar and MOS transistors cannot be optimized. Optimizing characteristics of the bipolar transistor typically affects the characteristics of the MOS transistor. In order to improve the characteristics of both transistors, the base and channel region may be separated. In the latter, the collector and drain are electrically connected together, and the emitter and source are electrically connected together, but the base and channel regions are separate. Because the base and channel regions are separate, many of the characteristics of the bipolar transistor may be adjusted separately from the characteristics of the MOS transistor. Still, the uses of the BiMOS device may be limited because the collector and drain are electrically connected and the emitter and source are electrically connected together. A high potential on the collector will also be on the drain and may cause channel punchthrough within the MOS transistor.

Many of the BiMOS devices described above have a bipolar transistor that is triggered by the MOS transistor. The base or channel regions in these types of devices are typically connected to something else. To be more specific, the base or channel region is typically connected to about ground potential, $V_{DD}$ or another component. In any event, the base or channel regions are not allowed to electrically float.

SUMMARY OF THE INVENTION

The present invention includes a BiMOS device having an MOS transistor that triggers a bipolar transistor, wherein the base and channel region are formed within a well region that electrically floats. The present invention also includes a BiMOS device having an MOS transistor that triggers a bipolar transistor, wherein the drain and collector regions are separated from one another. The present invention further includes processes for forming the BiMOS devices. In one embodiment of the present invention, the base and channel regions are also separate from one another to allow the performance of the MOS and the bipolar transistors to be optimized independent of each other. The embodiment also includes an electrically floating well region that triggers the bipolar transistor by charge accumulation, as opposed to inversion.

One of the embodiments of the present invention has many benefits. As previously mentioned, both the bipolar and MOS transistors may be individually optimized for performance. The separate collector and drain allow different potentials to be used on the bipolar and MOS transistors. The BiMOS device is fairly easy to form. The BiMOS device requires only one level of polycrystalline silicon. The embodiment does not have a contact to a well region because it electrically floats. Similarly, an extrinsic base region (also called an inactive base region) is not needed. Therefore, substrate area occupied by the BiMOS device is not wasted by an extra contact.

Other objects, features, and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION OF THE EMBODIMENTS

The present invention includes a BiMOS device having an MOS transistor that triggers a bipolar transistor, wherein the base and channel region are formed within a well region that electrically floats. The present invention also includes a BiMOS device having an MOS transistor that triggers a bipolar transistor, wherein the drain and collector regions are separated from one another. The present invention further includes processes for forming the BiMOS devices. In one embodiment of the present invention, the base and channel regions are also separate from one another to allow the performance of the MOS and the bipolar transistors to be optimized independent of each other. The embodiment also includes an electrically floating well region that triggers the bipolar transistor by charge accumulation, as opposed to inversion.

One of the embodiments of the present invention has many benefits. As previously mentioned, both the bipolar and MOS transistors may be individually optimized for performance. The separate collector and drain allow different potentials to be used on the bipolar and MOS transistors. The BiMOS device is fairly easy to form. The BiMOS device requires only one level of polycrystalline silicon (polysilicon). The embodiment does not have a contact to a well region because it electrically floats. Similarly, an extrinsic base region (also called an inactive base region) is not needed.

EXAMPLE

Figure 1:
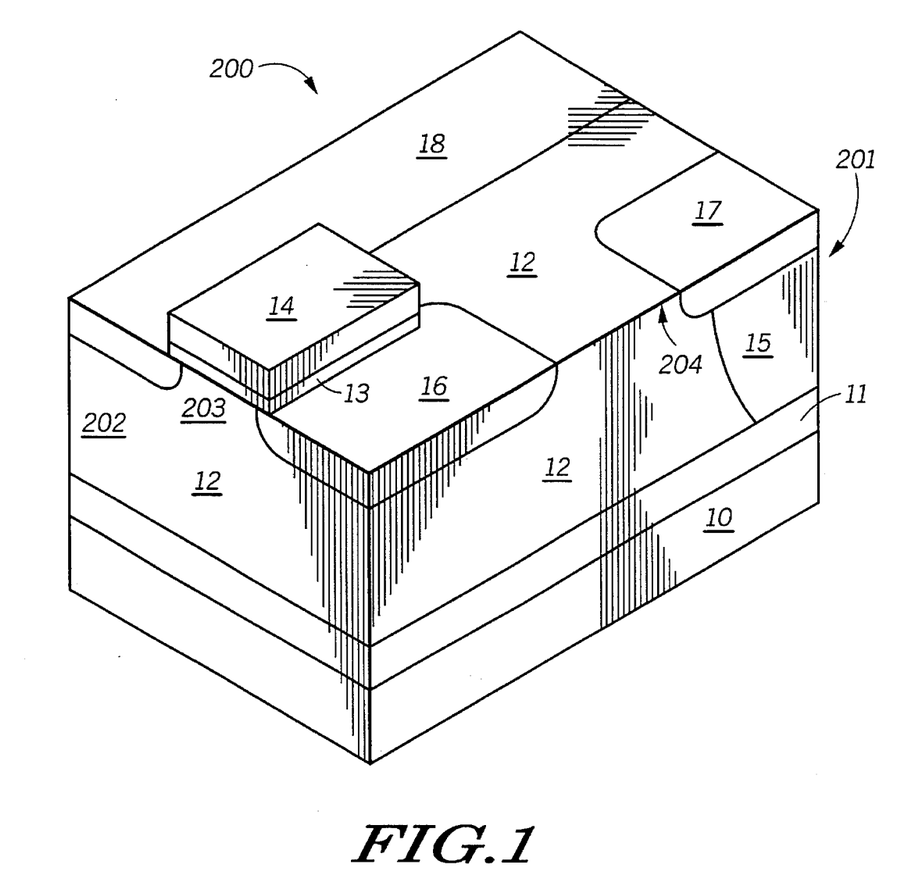
FIG. 1 includes a perspective view of a portion of a substrate that includes a BiMOS device formed in accordance with one embodiment of the present invention.

FIG. 1 includes a perspective view of a portion of a substrate that includes a BiMOS device 200 formed in accordance with one embodiment of the present invention. The BiMOS device 200 is formed on a lightly p-type doped silicon substrate (substrate) 10, wherein the p-type dopant is boron. A heavily-doped n-type buried layer (buried layer) 11 lies on the substrate, wherein the n-type dopant is arsenic. As used in this specification, "lightly doped" means that the dopant concentration is no more than 1E17 atoms per cubic centimeter, and "heavily doped" means that the dopant concentration is at least 1E19 atoms per cubic centimeter. A lightly-doped, p-type well region (well region) 12, which is doped with boron, lies on the buried layer 11. The well region 12 has a primary surface 204, and the distance between the primary surface 204 and the buried layer 11 is about 0.5 micron. A gate dielectric layer 13 and a gate electrode 14 overlie the well region 12. The gate electrode 14 is made of polysilicon that is heavily doped with phosphorus.

The BiMOS device 200 further includes heavily-doped, n-type regions 16, 17, and 18. Each of the n-type regions 16, 17, and 18 is doped with arsenic. The n-type region 16 acts as a drain for a MOS transistor, the n-type region 17 acts as part of a collector for a bipolar transistor, and the n-type region 18 acts both as an emitter for the bipolar transistor and as a source for the MOS transistor. The gate electrode extends in two directions that are generally perpendicular to each other. In the first direction, the gate electrode 14 overlies the well region 12 lying at the primary surface 204 and between the n-type regions 16 and 18 and overlies a portion of each of n-type regions 16 and 18. In the second direction, the gate electrode 14 overlies a portion of the well region 12 that lies at the primary surface 204. The collector 201 for the bipolar transistor is made up of the buried layer 11, the n-type region 17 (that may also be called the surface region of the collector), and a connecting region 15, which electrically connects the n-type region 17 to the buried layer 11. The connecting region 15 is a region within the well region 12 and is doped with phosphorus. The doping concentration of connecting region 15 is no less than 5E17 atoms per cubic centimeter. A base region 202 for the bipolar transistor lies within the well region 12 and between the n-type region 17 and the buried layer 11. A channel region 203 lies at the primary surface 204 of the well region 12, beneath the gate dielectric layer 13, and between n-type regions 16 and 18. The well region 12, which includes the base region 202 and the channel region 203, is allowed to electrically float. The operation of the BiMOS device 200 is described later in this specification.

Figure 2:
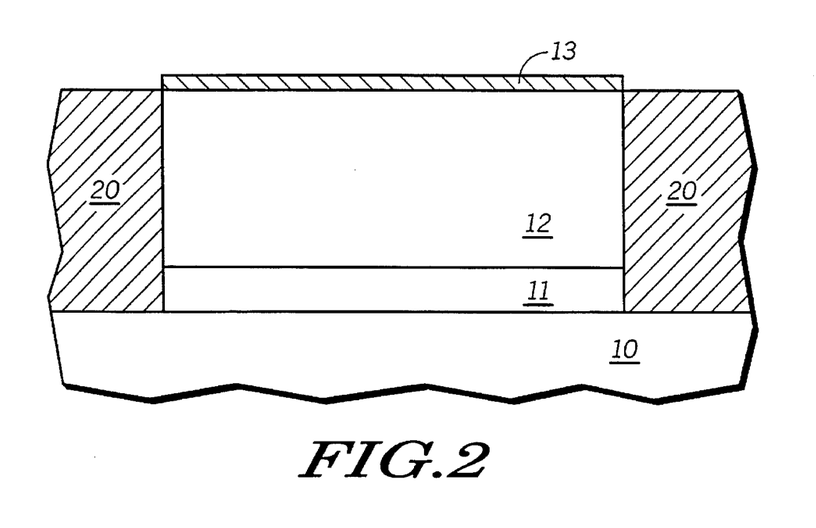
FIGS. 2–7 include top or cross sectional views of a portion of a substrate at various process steps in forming the BiMOS device of FIG. 1.

FIGS. 2–8 include illustrations of the substrate at various processing steps in forming the BiMOS device 200 in accordance with one embodiment of the present invention. Referring to FIG. 2, the substrate 10 is heavily doped with arsenic to form the buried layer 11. A silicon layer is epitaxially grown to a thickness of about 0.6 micron. The silicon layer is lightly doped with boron during the epitaxial growth. During the formation of the silicon layer, the arsenic from the buried layer 11 diffuses about 0.1 micron into the silicon layer. The distance between the buried layer 11 and the top of the silicon layer is about 0.5 micron.

Isolation region 20 is formed around the silicon layer and the buried layer 11 as shown in FIG. 2. The isolated silicon layer forms the well region 12. The isolation region 20 is formed by etching a trench through both the silicon layer and the buried layer 11. A p-type dopant (not shown) is ion implanted into the bottom of the trench to increase the isolation between adjacent devices. The trench is filled with silicon dioxide, and the substrate is planarized to remove the silicon dioxide lying on the well region 12. The steps of filling and planarizing are performed using conventional methods. A threshold voltage implant (not shown) may be performed to adjust the threshold voltage of the subsequently formed MOS transistor. The gate dielectric layer 13 is formed on the well region 12.

The polysilicon layer 31 is deposited and patterned to form a gate electrode 14. The gate electrode 14 extends about 0.5 micron in the first direction. A protective oxide 40 is formed by thermally growing silicon dioxide along all exposed surfaces of the gate electrode 14 and the well region 12. A masking layer is formed over the substrate 10 that includes an opening where the subsequently formed connecting section 15 will be located. A heavy dose (at least 1E15 ions per square centimeter) and high energy (at least 100 kiloelectron volts) phosphorus ion implant is performed. The masking layer is removed and another masking layer is formed that includes three openings over the well region 12 where the n-type regions 16–18 are formed. The well region 12 is selectively and heavily doped with arsenic to form the n-type regions 16–18. The substrate is annealed to activate and diffuse the dopants that form the connecting region 15 and the n-type regions 16–18.

Figure 3:
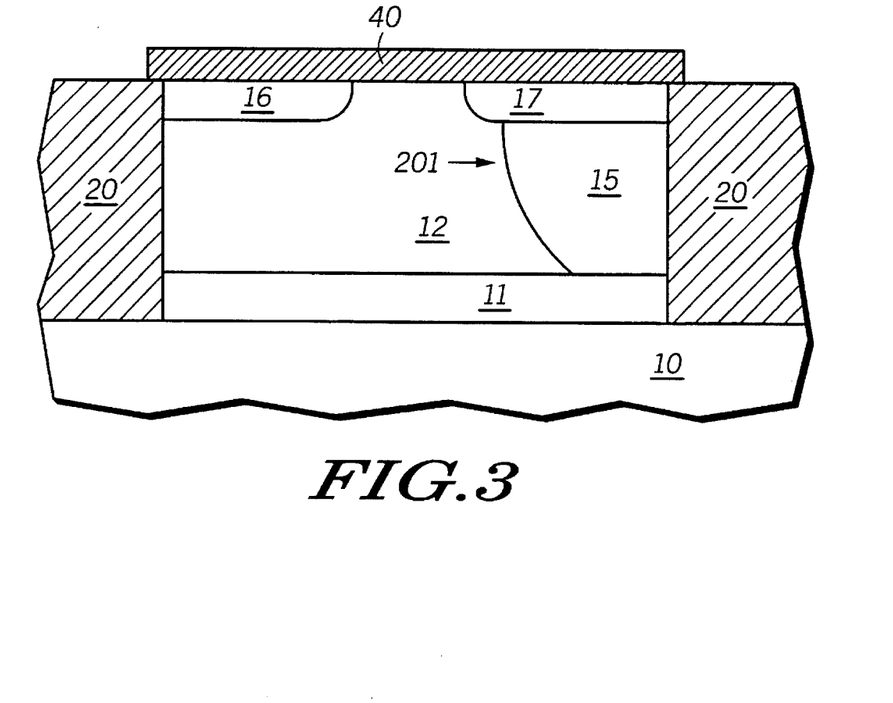
Figure 4:
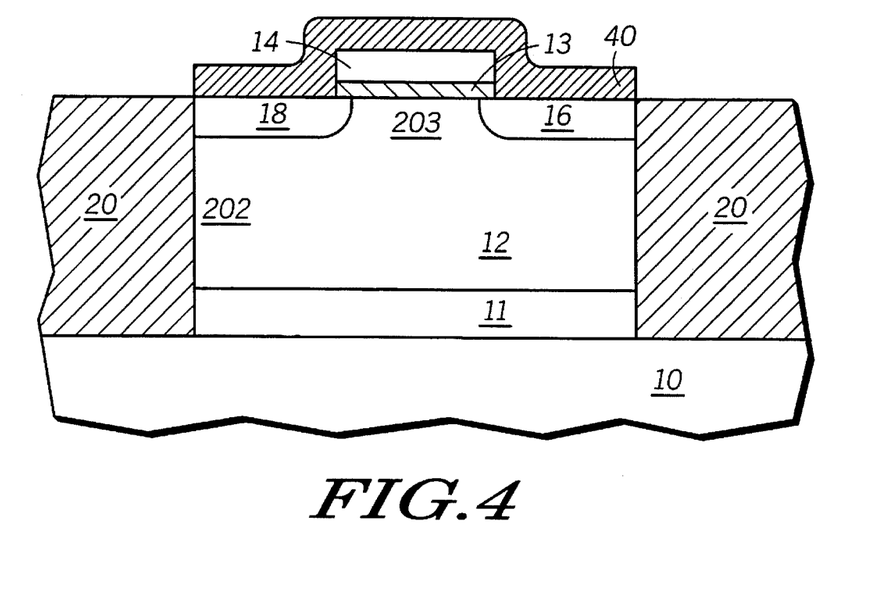
Figure 5:
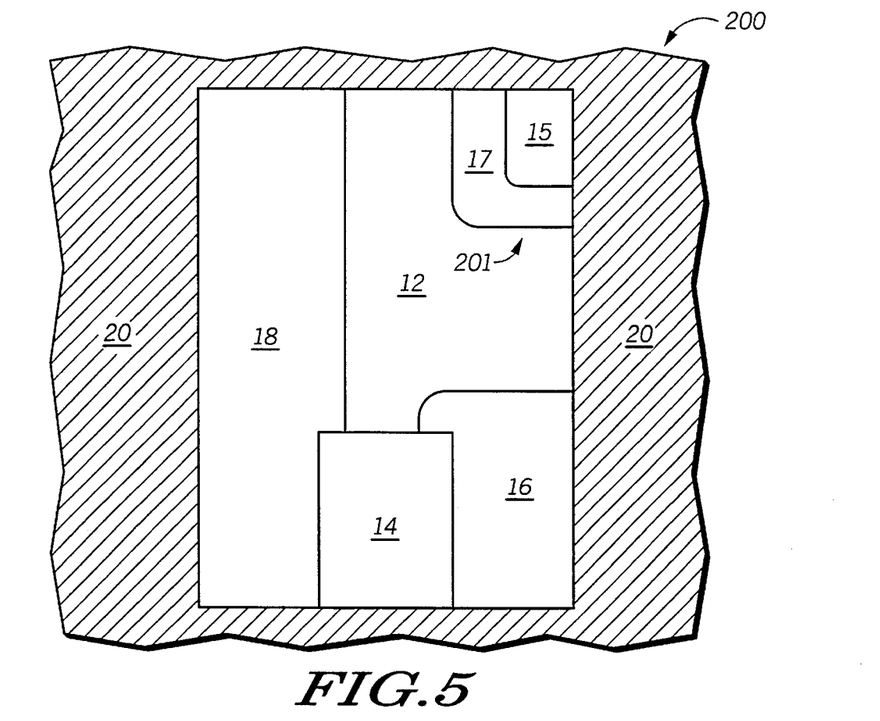

FIGS. 3–5 illustrate the substrate at this point in the process. FIG. 3 includes an illustration of a cross-sectional view of the substrate taken along the edge of the BiMOS device that has both the connecting region 15 and the n-type region 16. The connecting region 15 contacts both the n-type region 17 and the buried layer 11. The combination the connecting region 15, n-type region 17, and the buried layer 11 form the collector 201. The connecting region 15 may include some dopant from the buried layer 11 and the n-type region 17. Likewise, the buried layer 11 and n-type region 17 may include some dopant from the connecting region 15. The gate electrode 14 is not seen in FIG. 3 because the illustration of FIG. 3 is at an edge of the BiMOS device 200 where the gate electrode 14 is not present. FIG. 4 includes an illustration of a cross-sectional view of the substrate taken along the edge of the BiMOS device 200 that has both the n-type regions 16 and 18. The channel region 203 is about 0.3 micron long, lies at the surface of the well region 12, and lies between n-type regions 16 and 18. The n-type regions 16 and 18 act as the drain and source, respectively. The n-type region 18 also acts as the emitter. The base region 202 is about 0.3 micron wide, is within the well region 12, and lies between n-type region 18 and the buried layer 11. The distance between the n-type regions 17 and 18 is greater than the width of the base region 202, so that the base region 202 is formed in the well region 12 between the buried layer 11 and the n-type layer 18. FIG. 5 includes an illustration of a top view of the BiMOS device 200, which is surrounding by the isolation region 20. FIG. 5 does not illustrate the protective layer 40 for simplicity. FIG. 5 shows that the BiMOS device 200 has its collector 201 separate from its drain (n-type region 16). The n-type region 18 acts as both the emitter and source.

Figure 6:
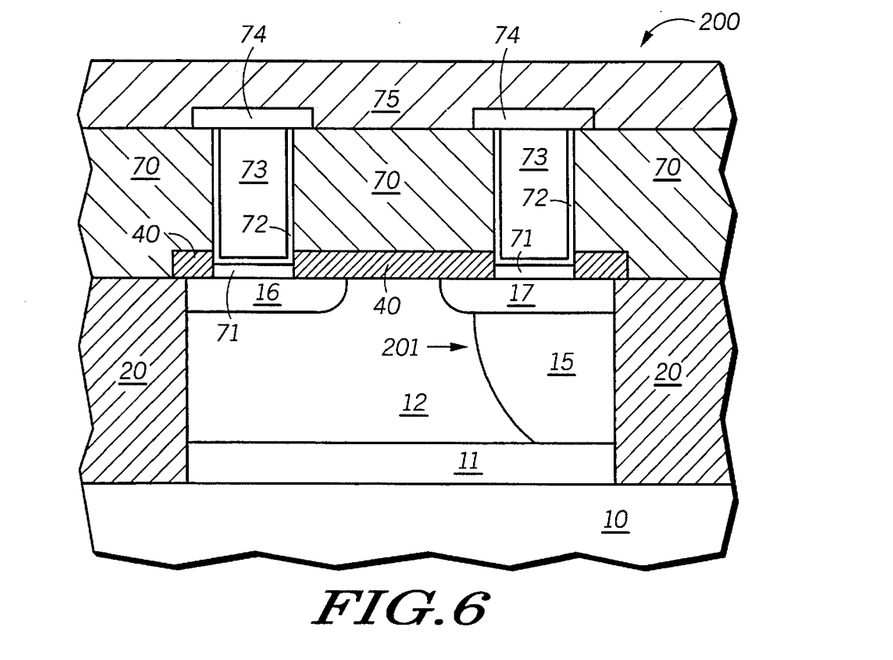
Figure 7:
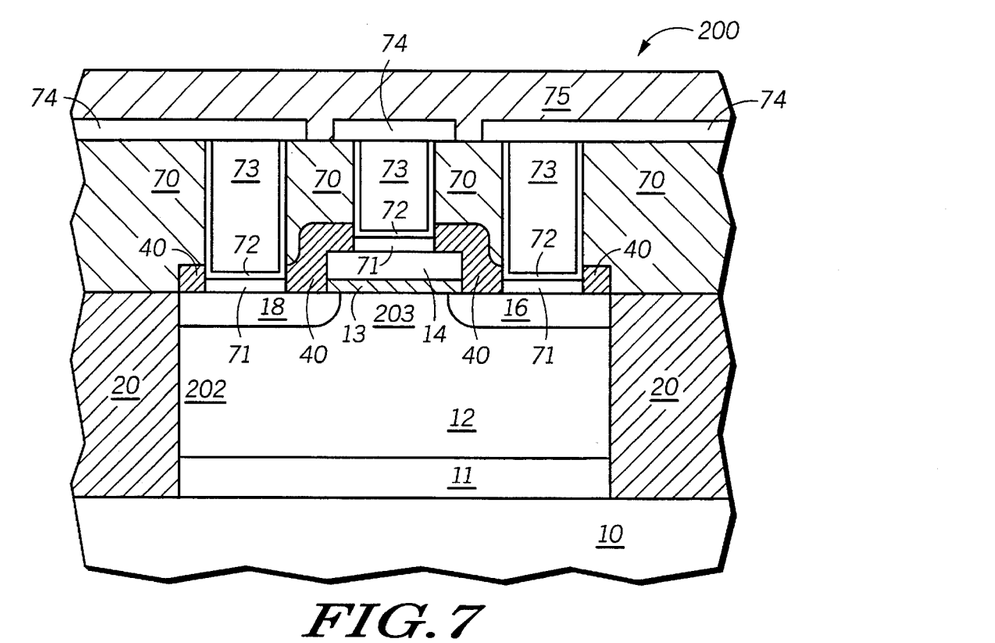

FIGS. 6 and 7 include illustrations of the substantially finished BiMOS 200. A borophosphosilicate glass (BPSG) layer 70 is deposited over the substrate and planarized. The BPSG layer 70 is a type of doped glass layer, which is also an insulating layer. Contact openings are formed within the BPSG layer 70, and the contact openings extend to the gate electrode 14 and n-type regions 16–18. Titanium is deposited on the BPSG layer 70 and within the contact openings and is reacted to form a titanium silicide layer 71 at the bottom of the contact openings. Unreacted titanium is removed. A titanium nitride layer 72 and a tungsten layer 73 are sequentially deposited on the BPSG and within the contact openings. The portion of the titanium nitride and tungsten layers 72 and 73 that lie on the BPSG layer 70 are removed to form contact plugs made of the titanium silicide layer 71, the titanium nitride layer 72, and the tungsten layer 73. An interconnecting layer 74 is formed by depositing and patterning an aluminum layer on the BPSG layer 70 and the contact plugs. A passivation layer 75 is formed by depositing a layer of silicon oxynitride. FIG. 6 includes an illustration of the BiMOS device 200 along the edge of the well region 12 having the n-type regions 16 and 17. FIG. 7 includes an illustration of the BiMOS device 200 along the edge of the well region 12 having the n-type regions 16 and 18. If needed, interlevel insulating layers, via openings and vias, and additional interconnecting levels may also be formed. Conventional methods are used to form the layers, openings, contacts, and vias described in this paragraph.

In the finished BiMOS device 200, electrical connections are made to the gate electrode 14, the collector 201, and n-type regions 16 and 18 (drain and emitter/source). Unlike typical prior art BiMOS devices, the BiMOS device 200 has a well region 12, which includes the channel and base regions 203 and 202, that is isolated and not electrically connected to any other part of the device. Therefore, the well region 12 is allowed to electrically float. The significance of the electrically floating well region 12 is discussed later with respect to the operation of the device.

OPERATION AND BENEFITS OF THE EXAMPLE

The BiMOS device 200 operates by having a MOS transistor that acts as a trigger for a bipolar transistor. A specific example is used to illustrate the operation of the BiMOS device 200. The specific example is not meant to be limiting. Other operating conditions other than those specifically listed may be used with the BiMOS device 200. The collector 201 is at a potential of about five volts, the drain (n-type region 16) is at a potential of about three to about five volts, and the emitter/source (n-type region 18) is at about ground potential. To turn on the bipolar device, the gate electrode 14 is biased to a potential of about three to about five volts.

After the gate electrode 14 is biased, an electric field is formed such that the electric field is stronger within the channel region 203 near the drain compared to the portions of the well region 12 near the emitter/source. Electrons accelerate toward the drain. Some of the electrons have enough energy that they hit electrons of atoms causing the electrons to be stripped from the atoms, thereby forming electron-hole pairs. This phenomenon is called carrier multiplication. The electrons are attracted towards the drain, and the holes are repelled by the electric field. The holes accumulate in the well region 12 causing its potential to rise above ground potential. When the potential of the well region 12 is sufficiently positive to initiate substantial electron injection from the emitter/source, the bipolar transistor turns on. The hole concentration needed to be attained to turn on a larger hole concentration in the well region 12 before the bipolar transistor depends on the doping concentration within the well region 12. An electric field is present near the collector similar to the electric field near the drain, although the magnitude of the electric field may be different. Electrons flowing from the emitter/source are accelerated by the electric field near the collector resulting in carrier multiplication near the collector similar to carrier multiplication near the drain. The carrier multiplication near the buried layer 11 of the collector 201 becomes large enough to sustain current flow within the bipolar transistor. Also, the positive potential on the well region 12 may cause bipolar action between the source and drain of the MOS transistor, which would also help sustain current flow in the bipolar transistor. When this occurs, the potential on the gate electrode 14 may be removed, and the bipolar transistor stays on. If the well region 12 is not electrically floating, the bipolar transistor could not be turned on in the method just described. If the well region is grounded, the holes generated by the MOS transistor are attracted to the well ground, and therefore, the bipolar transistor would not turn on. Many other types of BiMOS devices do not have a base or channel region that electrically floats.

The embodiment described above includes many benefits. The structure of the BiMOS device 200 allows the characteristics of the MOS and bipolar transistor to be individually tailored. The base region 202 and the channel region 203 are not the same region. Many bipolar transistor characteristics are determined by the width and the doping concentration of the base region 202. The width of the base region is determined by the thickness of the epitaxial silicon layer and the amount of dopant diffusion from the buried layer 11 and the n-type region 18. The doping concentration of the base region 202 is about the same as the doping concentration during the formation of the epitaxial silicon layer. Many MOS transistor characteristics are determined by the length and the doping concentration of the channel region 203. The channel length is determined in part by the width of the gate electrode 14 and dopant diffusion from n-type regions 16 and 18. The dopant concentration within the channel region 203 is determined by the doping concentration of the epitaxial silicon layer and any threshold adjusting implants that may be performed. In this manner, both the bipolar and MOS transistors may be individually optimized for performance.

The base region 202 and collector 201 are not part of the MOS transistor and the channel region 203 and the drain (n-type region 16) are not part of the bipolar transistor. The collector 201 may be operated independently of drain, and vice versa. In this manner, an MOS logic transistor that may have a threshold voltage of about one volt may be used with a high voltage or high power bipolar transistor. A high potential on the collector 201 virtually cannot cause channel punchthrough in the MOS transistor. Obviously, the present invention may be used with a low voltage or low power bipolar transistor. The base region 202 and collector 201 being separate from the channel region 203 and drain allows more design flexibility of the BiMOS device 200.

The BiMOS device 200 is fairly easy to form. The BiMOS device requires only one level of polysilicon. There is no contact to the well region 12 because the well region 12 electrically floats. Similarly, an extrinsic base region (also called an inactive base region) is not needed. Therefore, substrate area occupied by the BiMOS device is not wasted by an extra contact.

FABRICATION OPTIONS OF THE EXAMPLE

Numerous fabricating options are available for the formation of the BiMOS device 200 described above. The doping concentration of the substrate 10 may be any value, although a doping concentration of less than 1E17 atoms per cubic centimeter is typically used. Substrate 10 may be replaced with other semiconductor materials, such as germanium, germanium-silicon, diamond, III–V semiconductors, and the like. Substrate 10 may be replaced by an insulating layer, such as silicon dioxide, sapphire, and the like. The conductivity types of all of the layers and regions may be reversed. P-type dopants that may be used include boron, gallium, aluminum, or the like. N-type dopants that may be used include phosphorus, arsenic, antimony, or the like. The isolation regions 20 may be formed by a local oxidation method, such as LOCOS, instead of a trench-fill method. If a LOCOS method is used, the isolation region 20 must extend into the substrate at least as deep as the interface between the substrate 10 and buried layer 11. The gate dielectric layer 13 may be nitrided. The gate dielectric layer typically includes silicon dioxide or silicon oxynitride. The gate dielectric layer may also be a composite of any combination of silicon dioxide, silicon oxynitride, and silicon nitride. The polysilicon layer used to form the gate electrode 14 may be replaced by an amorphous silicon layer.

In the embodiment of the Example, specific materials are listed for the doped glass layer, contacts, interconnecting layer, and passivation layer. Other equivalent materials may be substituted for the specific materials listed. For example, phosphosilicate glass may be used in place of the BPSG layer 70; the contacts may be polysilicon plugs or part of the material that forms the interconnecting layer 74; copper may be used in place of aluminum in the interconnecting layer 74; and phosphosilicate glass or silicon nitride may be used in place of or with silicon oxynitride in the passivation layer 75. The list is not intended to be limiting, but to illustrate options available. Other process considerations may need to be taken into account if the materials if the embodiment of the Example are changed. For example, copper typically needs to be encapsulated with a material, such as molybdenum or silicon nitride.

The width of the gate electrode 14 is about 0.5 micron. The BiMOS device 200 may be used with technologies of other sizes. The design rules of the BiMOS device 200 may be greater than 1.0 micron or as small as 0.25 micron.

OTHER EMBODIMENTS

Figure 8:
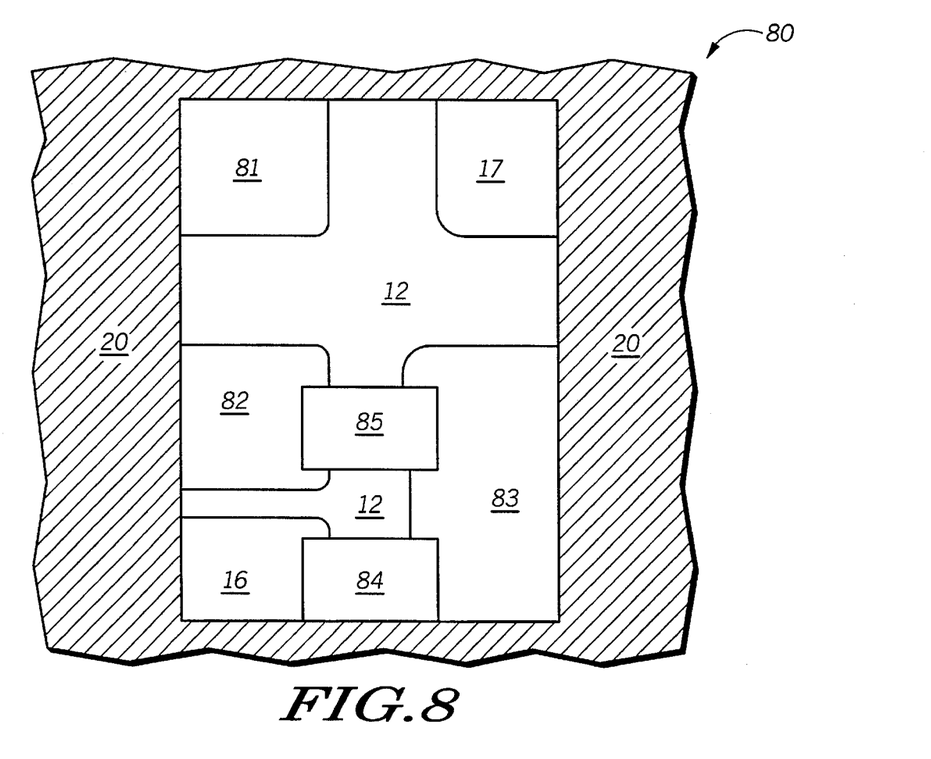
FIGS. 8–11 include top views of a portion of a substrate to illustrate other BiMOS devices formed in accordance with other embodiments of the present invention.
Figure 9:
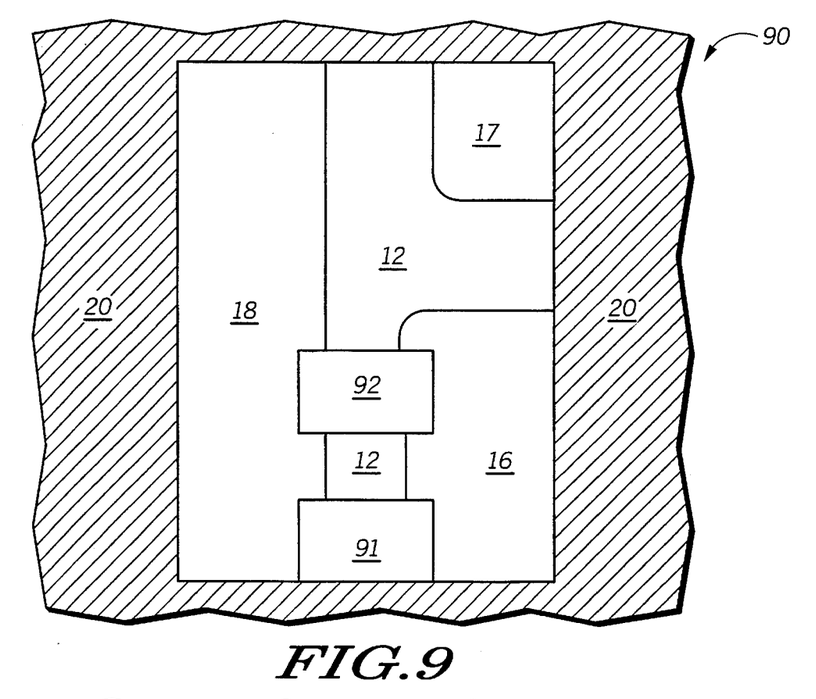

FIG. 8 includes a BiMOS device 80 that has a couple of MOS transistors and a separate emitter and source. In the BiMOS device 80, n-type region 16 acts as a drain, n-type region 83 acts as a source/drain region, n-type region 82 acts as a source, n-type region 81 acts as the emitter, and the n-type region 17 is part of the collector. The arrangement of the two MOS transistors form an "AND" gate. When potentials on both gate electrodes 84 and 85 are above the threshold voltages for each of their respective MOS transistors, electrons flow between the n-type region 82 and the n-type region 16. The BiMOS device 80 operates in a manner similar to the BiMOS device 200; both use a hot-electron generating mechanism. Both MOS transistors of the BiMOS device 200 must be on to trigger the bipolar transistor. FIG. 9 is similar to FIG. 8 except that the BiMOS device 90 has two MOS transistors that form an "OR" gate and has the combined emitter/source similar to the embodiment of the Example. Unlike the embodiment of FIG. 8, a potential on either gate electrode 91 or 92 that is above the threshold voltage for its respective MOS transistor will trigger the bipolar transistor.

Figure 10:
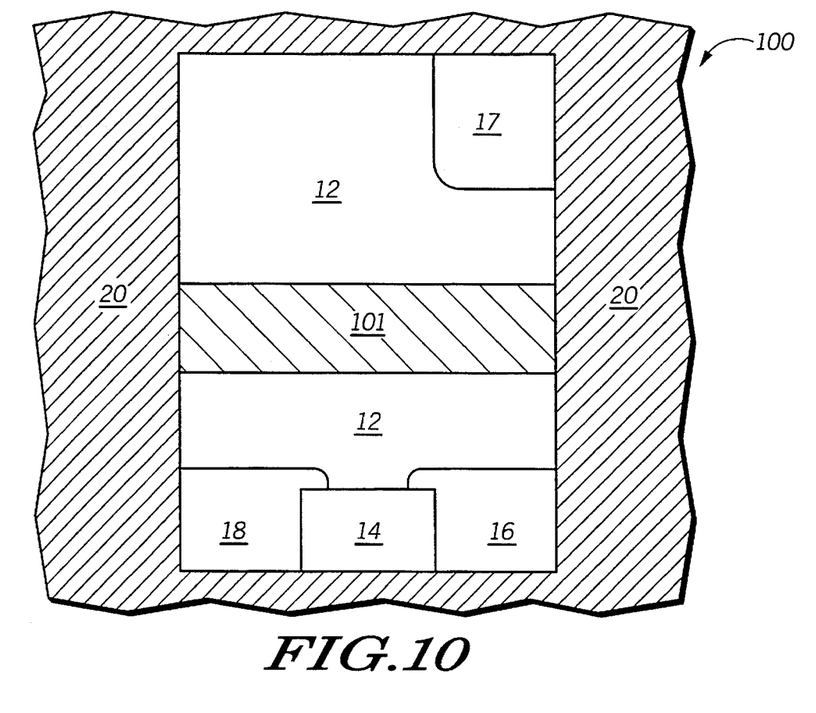
Figure 11:
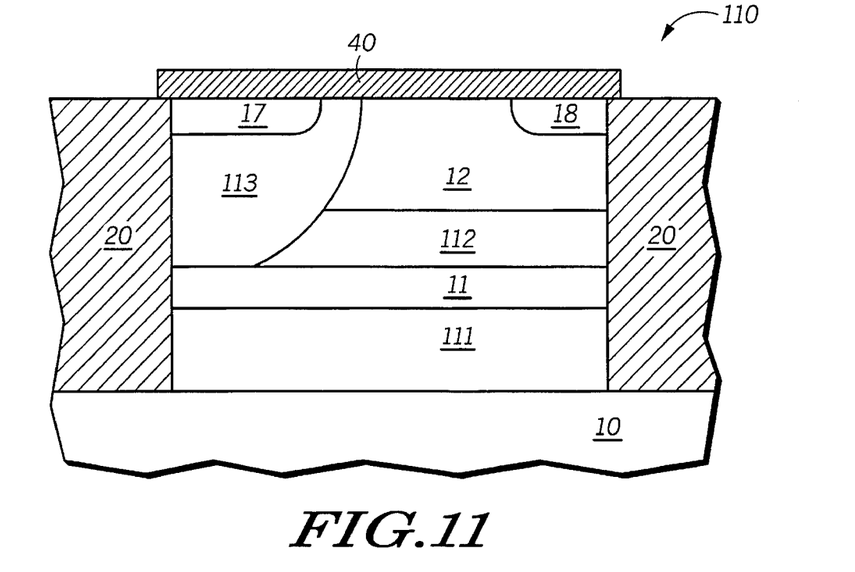

FIGS. 10 and 11 illustrate embodiments that may be used with high voltage or high power applications. In FIG. 10 includes a BiMOS device 100 that has an isolation region 101 that reduces the chances of punchthrough between the n-type region 17, which is part of the collector, and n-type regions 16 and 18, which act as the drain and emitter/source, respectively. The isolation region 101 may extend any depth down from the upper surface of the well region 12, but cannot extend completely through the buried layer 11 (not shown). The isolation region 101 may be a p-type region that is moderately or heavily doped (at least 1E17 atoms per cubic centimeter) or an oxide-filled trench.

FIG. 11 includes BiMOS device 110 that has increased immunity to junction breakdown for various parts of the collector. FIG. 11 includes a cross-sectional view of the BiMOS device 110 along one of its edges that has both n-type regions 17 and 18. Formation of the BiMOS device 110 is similar to the formation of the BiMOS device 200. A first n-type doped epitaxial silicon layer 111 is deposited on substrate 10. The surface of the first epitaxial layer 111 is heavily doped to form buried layer 11. A second epitaxial silicon layer is deposited on the buried layer 11. Part of the deposition includes an n-type dopant to form a second n-type epitaxial silicon layer 112, and part of the deposition includes a p-type dopant that subsequently forms the well region 12. The isolation region 20 is formed and contacts the substrate 10. The processing of the BiMOS device 110 is substantially the same as the BiMOS device 200 up to and including the patterning of the polysilicon layer 31 (not shown). After patterning the polysilicon layer 31, the well region 12 is selectively doped with phosphorus similar to forming the connecting region 15 in the embodiment of the Example. Unlike the embodiment of the Example, the substrate is annealed for a relatively long time to allow the phosphorus to laterally diffuse and form connecting region 113, such that subsequently formed n-type region 17 is formed completely within the connecting region. After the connecting region 113 is formed, the n-type regions 16 (not shown), 17, and 18 are formed in a manner similar to the embodiment of the Example. The rest of the processing of the BiMOS device 110 is substantially the same as BiMOS device 200. The doping concentration of a portion of the connecting region 113 is no less than 5E17 atoms per cubic centimeter, although a portion of the connecting region 113, which is away from the isolation region 20, may have a lower doping concentration. The n-type layers 111 and 112 are doped with arsenic, and the doping concentrations of the n-type layers 111 and 112 and the n-type region 113 are no more than 1E18 atoms per cubic centimeter. These layers and region form less abrupt diffusion junctions around the collector to reduce the likelihood of junction breakdown or punchthrough.

Figure 12:
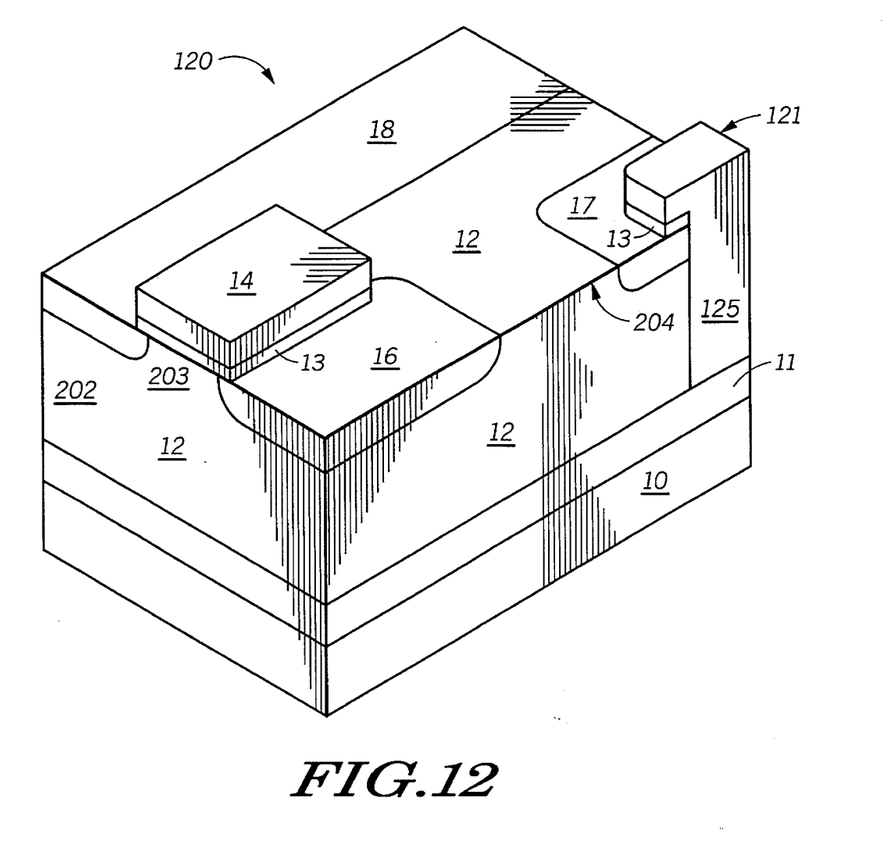
FIGS. 12–18 include perspective or cross-sectional views of a portion of a substrate to illustrate another BiMOS device formed in accordance with another embodiment of the present invention.
Figure 13:
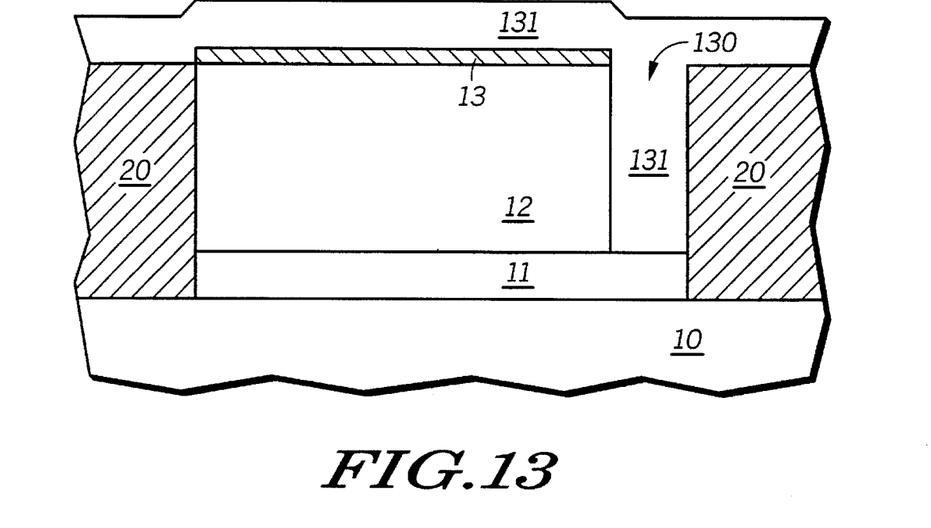

FIGS. 12–18 include another embodiment of the present invention. FIG. 12 includes a BiMOS device 120 having a collector 121 with a connecting section 125, which is a polysilicon plug instead of a diffused region. The fabrication of this embodiment is similar to the fabrication of the BiMOS device 200. After forming the gate dielectric layer, a masking layer (not shown) is formed over a portion of the well region 12 and includes a masking layer opening where the connecting region 125 is subsequently formed. An opening 130 is etched though both gate dielectric layer 13 and the well region 12 as shown in FIG. 13. The opening 130 contacts the buried layer 11 and is about 0.5 micron wide. The masking layer is removed after the opening 130 is formed. A polysilicon layer 131 about 3000 angstroms thick is deposited over the gate dielectric layer 13 and isolation region 20, and within the opening 130. The polysilicon layer 131 is in-situ doped with phosphorus and is heavily doped. The polysilicon layer 131 is patterned to form a gate electrode 14 and the connecting region 125. The balance of the processing to form the BiMOS device 120 is virtually identical to the embodiment of the Example except that the masking step to define connecting section 15 and its related doping step are not performed.

Figure 14:
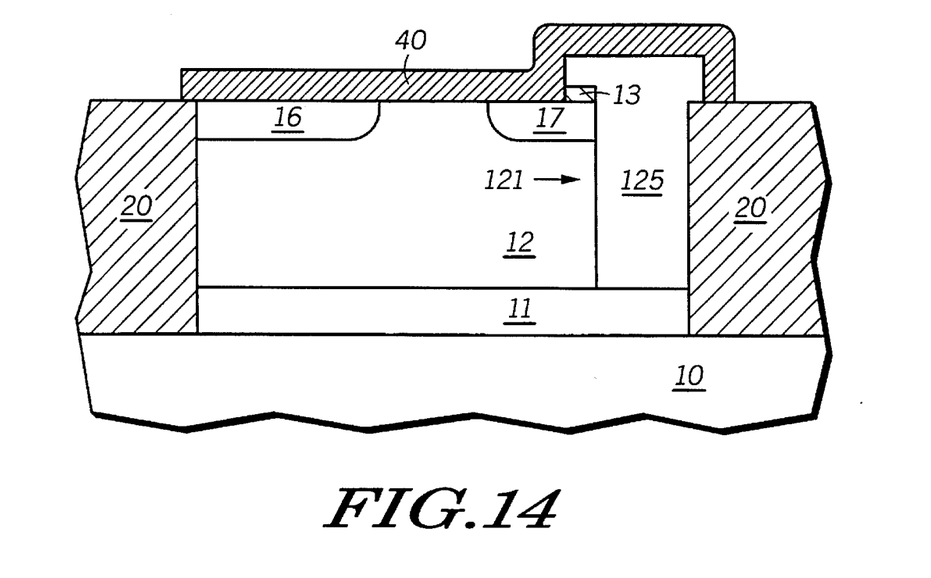
Figure 15:
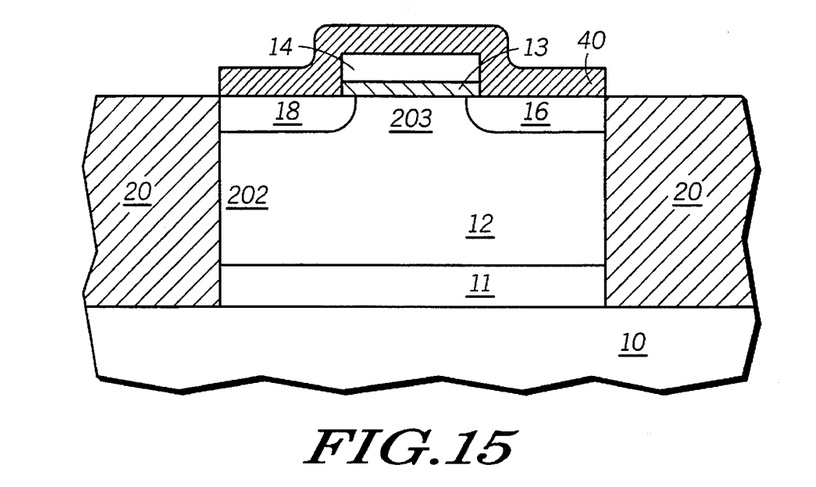
Figure 16:
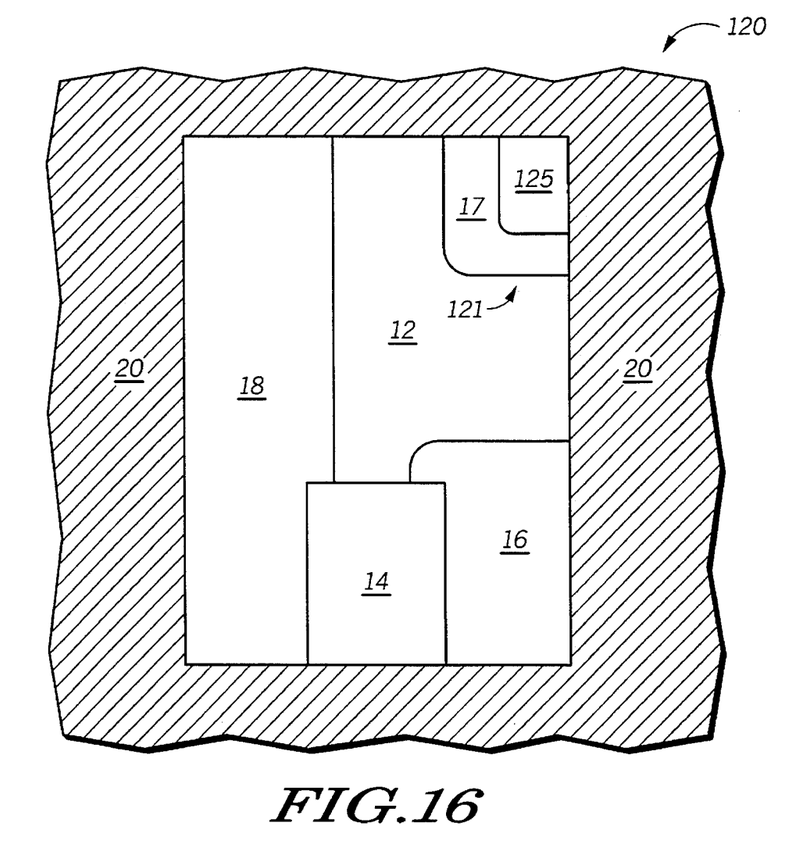
Figure 17:
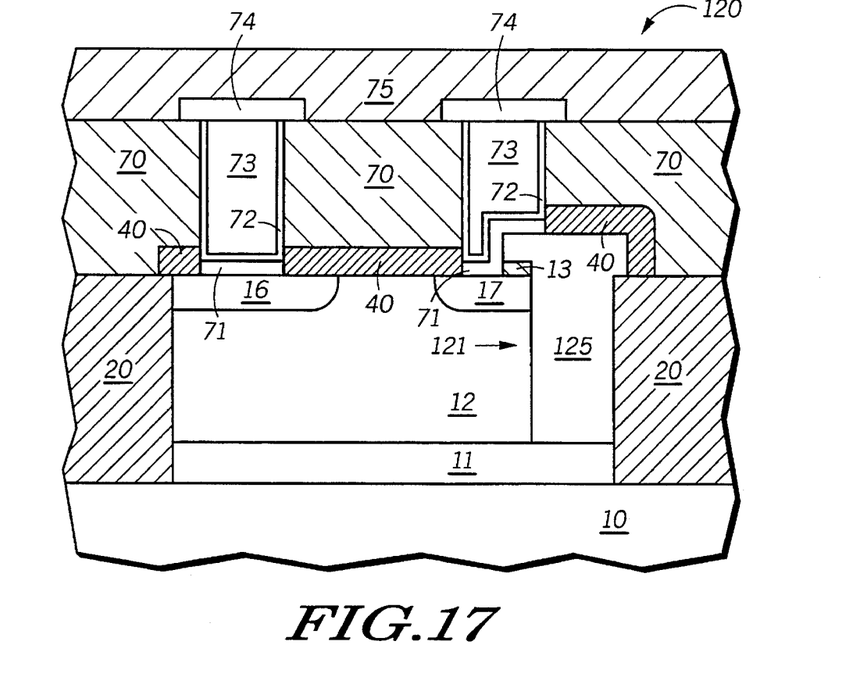
Figure 18:
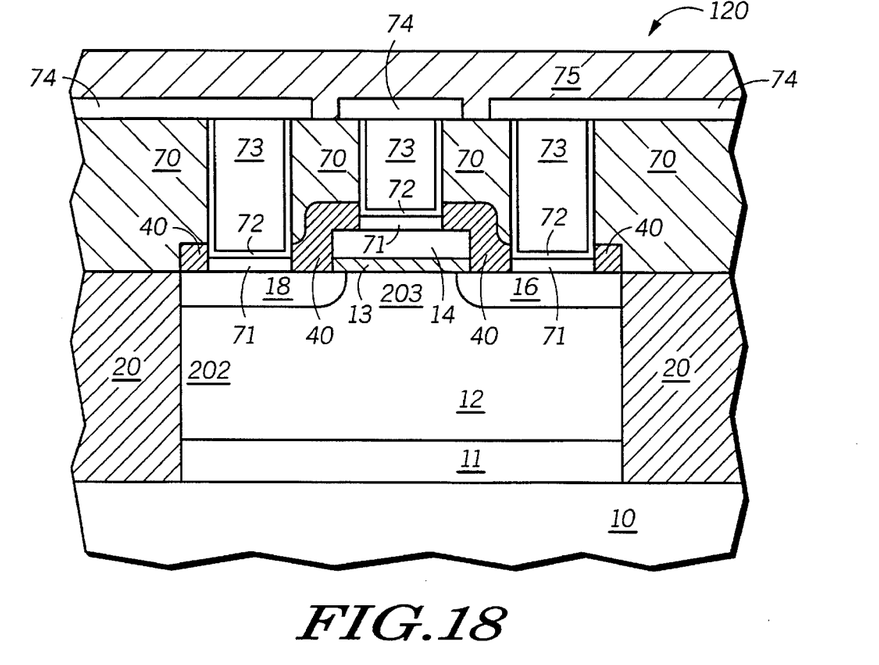

FIGS. 14–16 illustrate the substrate after the n-type regions 16–18 are formed. FIG. 14 includes an illustration of a cross-sectional view of the substrate taken along the edge of the BiMOS device that has both the connecting region 125 and the n-type region 16. The connecting region 125 contacts both the n-type region 17 and the buried layer 11. The combination the connecting region 125, n-type region 17, and the buried layer 11 form the collector 121. FIG. 15 includes an illustration of a cross-sectional view of the substrate taken along the edge of the BiMOS device that has both the n-type regions 16 and 18. FIG. 15 is virtually identical to FIG. 4. FIG. 16 includes an illustration of a top view of the BiMOS device 120, which is surrounding by the isolation region 20. FIG. 16 does not illustrate the protective layer 40 for simplicity. FIGS. 17 and 18 include illustrations of the substantially finished BiMOS device 130. FIGS. 17 and 18 are similar to FIGS. 6 and 7 except near the connecting section 125.

Other "plug-type" connecting sections can be formed. For example, the plug may be formed by separate deposition and doping steps instead of depositing in-situ doped polysilicon. The connecting section may be formed at the same time as forming contacts, and not prior to forming n-type regions 16–18. After forming contact openings, another masking layer is formed that has an opening over the contact opening to the n-type region 17. A silicon etch step is formed to etch an opening through the n-type region 17 and the well region 12. The masking layer is removed and openings for the contacts and connecting section are filled to form plugs. The plugs may be made of silicon, a refractory-metal, such as titanium, tungsten, tantalum, molybdenum, cobalt, and the like, silicides of those refractory metals, or interconnecting metals, such as aluminum, copper, and the like. The plug material is usually deposited conformally, although a non-conformal deposition may also be performed. In order fill the opening for the connecting section using a conformal deposition, the width of the opening should not be more than twice the thickness of the layer to be deposited to form the plug. Additional patterning and metallization layers may be needed.

In an embodiment not shown, a base region may be formed at the upper surface of the well region 12. Referring to BiMOS device 200, connecting region 15 is not needed and the collector for the bipolar transistor would consist of the n-type region 17. The bipolar characteristics may be adjusted by changing the distance between n-type regions 17 and 18 and selectively doping that portion of the well region 12 that will form the base region. The buried layer 11 is also not needed if the well region 12 overlies an insulating material. If the substrate 10 is a semiconductor material, such as silicon, germanium, and the like, and there is no insulating material between the substrate 10 and the well region 12, the buried layer 11 is needed. The buried layer 11 isolates the well region 12 from the substrate 10, so that the well region 12 electrically floats. In still another embodiment that is not shown, the MOS transistor may be a depletion-mode transistor. To form a depletion-mode transistor, a depletion doping step is performed in place of a threshold adjusting doping step. The depletion dopant for BiMOS device 200 is an n-type dopant. In BiMOS device 200, the bipolar transistor does not turn on while the gate electrode 14 is at a negative potential. The bipolar transistor turns on when the potential on gate electrode 14 is removed. In a last embodiment, the n-type regions 16 and 17 may be replaced by a single continuous doped region that acts as both the collector and drain of the BiMOS device 200. In the last embodiment, a gate electrode extends in two directions similar to the BiMOS device 200. While the gate electrode extends in the first direction similar to BiMOS device 200, in the second direction, the gate electrode may overlie a portion or all of the well region at the primary surface. The channel width of the MOS transistor is a function of how far the gate electrode extends in the second direction. A wider channel width for the MOS transistor generally allows the bipolar transistor to be triggered faster than a narrow channel width for the MOS transistor. A potential placed on the continuous doped region of this last embodiment may be limited by the channel punchthrough voltage of the MOS transistor.

In the foregoing specification, the invention has been described with reference to specific embodiments thereof. It will, however, be evident that various modifications and changes can be made thereto without departing from the broader spirit or scope of the invention as set forth in the appended claims. The specification and drawings are, accordingly, to be regarded in an illustrative rather than a restrictive sense.

What is claimed is:

1. A process for forming a BiMOS device comprising the steps of:

forming a well region having a first conductivity type and a surface, wherein:
the well region includes a channel region of an MOS transistor and a base region of a bipolar transistor;
the well region overlies a substrate; and
an isolation region lies around sides of the well region;

forming first and second doped regions within the well region, wherein:
each of the first and second doped regions has a second conductivity type, which is opposite the first conductivity type;
each of the first and second doped regions lies adjacent to the surface of the well region; and
the first and second doped regions are separated from each other by the well region;

forming a gate dielectric layer overlying the well region; and forming a gate electrode, wherein the gate electrode overlies at least a portion of each of the following: the gate dielectric layer, the well region, and the first and second doped regions, wherein the well region is configured to electrically float.

2. The process of claim 1 further comprising steps of:

forming a buried layer within the substrate prior to the step of forming the well region, wherein:
the substrate has the first conductivity type;
the buried layer has the second conductivity type; and
the buried layer has a higher doping concentration compared to the well region; and forming a connecting region, wherein the connecting region:
electrically connects the second doped region to the buried layer; and
includes a material selected from a group consisting of tungsten, titanium, cobalt, tantalum, molybdenum, silicon, a refractory-metal silicide, titanium nitride, aluminum, copper, and a combination thereof.

3. The process of claim 1, wherein the substrate comprises a material selected from a group consisting of silicon dioxide, sapphire, and silicon having the first conductivity type.

4. The process of claim 1, wherein the step of forming the first and second doped regions is performed such that:

the first doped region acts as an emitter for the bipolar transistor and a source for the BiMOS device; and a plurality of second doped regions are formed and are separated from each other and the first doped region by the well region, wherein one of the second doped regions acts as a collector for the BiMOS device and another one of the second doped regions acts as a drain for the BiMOS device.

5. A process for forming a BiMOS device comprising the steps of:

forming a well region having a first conductivity type and a surface, wherein:
the well region overlies a substrate; and
a field isolation region lies around sides of the well region;

forming doped regions lying adjacent to the surface and within the well region, wherein the doped regions include:
a collector surface region having a second conductivity type, which is opposite the first conductivity type;
a drain region having the second conductivity type, wherein the drain region is separated from the collector surface region by the well region; and
a first doped region having the second conductivity type, wherein the first doped region is separated from both the collector surface and drain regions by the well region;

forming a gate dielectric layer over the well region; and forming a gate electrode over at least a portion of each of the following: the gate dielectric layer, the well region, and the drain and first doped regions, wherein the well region is configured to electrically float.

6. The process of claim 5, further comprising steps of:
forming a buried layer within the substrate prior to the step of forming the well region, wherein:
the substrate has the first conductivity type;
the buried layer has the second conductivity type; and
the buried layer has a higher doping concentration compared to the well region; and
forming a connecting region, wherein the connecting region:
electrically connects the collector surface region to the buried layer; and
includes a material selected from a group consisting of tungsten, titanium, cobalt, tantalum, molybdenum, silicon, a refractory-metal silicide, titanium nitride, aluminum, copper, and a combination thereof.

7. The process of claim 6, further comprising a step of forming a first doped layer prior to the step of forming the buried layer, wherein the first doped layer has the second conductivity type and a doping concentration no greater than 1E18 atoms per cubic centimeter.

8. The process of claim 5, wherein the step of forming the gate electrode forms a first gate electrode and a second gate electrode, wherein each of the first and second gate electrodes overlies a portion of the drain region and the first region.

9. The process of claim 5, wherein:
the step of forming the doped regions forms a source/drain region;
the step of forming the gate electrode forms a first gate electrode and a second gate electrode;
the first gate electrode overlies a portion of the drain region and the source/drain region; and
the second gate electrode overlies a portion of the source/drain region and the first doped region.

10. The process of claim 5, wherein the step of forming the doped regions forms a plurality of the first doped regions, wherein:
the first doped regions are separated from one another by the well region;
one of the first doped regions acts as a source region and is formed such that the gate electrode overlies a portion of it; and
another one of the first doped regions acts as an emitter region is formed such that it does not underlie the gate electrode.

11. The process of claim 6, wherein a portion of the field isolation region lies between the collector surface region and both the drain and first doped regions.

12. A process for forming a BiMOS device comprising the steps of:

forming a buried layer having a first conductivity type within a substrate, wherein the substrate includes silicon and has a second conductivity type, which is opposite the first conductivity type;

forming a first layer overlying the buried layer, wherein the first layer:
has the second conductivity type; and
has less doping concentration than the buried layer;

forming a field isolation region such that the field isolation region extends at least to the substrate and lies adjacent to sides of portions of the buried and first layers, wherein the portion of the first layer is laterally surrounded by the field isolation region and forms a well region having a surface;

forming a connecting region within the well region, wherein the connecting region overlies and extends to the buried layer;

forming heavily doped regions having the first conductivity type and lying adjacent to the surface and within portions of the well region:
a collector surface region overlying and extending to the connecting region and having a first doping concentration;
a drain region having the first doping concentration, wherein the drain region is separated from the buried layer and the collector surface region by the well region; and
a first doped region having the first doping concentration, wherein the first doped region is separated from both the collector surface region and the drain region by the well region;

forming a gate dielectric layer over the well region; and forming a gate electrode over at least a portion of each of the following: the gate dielectric layer, the well region, and the drain and first doped regions.

13. The process of claim 12, wherein the first doped region acts as an emitter and a source for the device.

14. The process of claim 12, wherein the step of forming the heavily doped regions forms a plurality of the first doped regions, wherein
one of the first doped regions acts as a source region and is formed such that the gate electrode overlies a portion of it; and
another one of the first doped regions acts as an emitter region is formed such that it overlies the buried layer and does not underlie the gate electrode.

15. The process of claim 12, further comprising a step of forming a first doped layer prior to the step of forming the buried layer, wherein the first doped layer has the first conductivity type and a doping concentration no greater than 1E18 atoms per cubic centimeter.

16. The process of claim 12, further comprising a step of forming a second doped layer between the steps of forming the buried layer and forming the first layer, wherein the second doped layer has the first conductivity type and a doping concentration no greater than 1E18 atoms per cubic centimeter.

17. The process of claim 12, wherein the step of forming the gate electrode forms a first doped gate electrode and a second gate electrode, wherein each of the first and second gate electrodes overlies a portion of the drain region and the first region.

18. The process of claim 12, wherein:

the step of forming the heavily doped regions forms a source/drain region;

the step of forming the gate electrode forms a first gate electrode and a second gate electrode;

the first gate electrode overlies a portion of the drain region and the source/drain region; and the second gate electrode overlies a portion of the source/drain region and the first doped region.

19. The process of claim 12, wherein the first layer is formed by epitaxially growing a silicon layer over the buried layer.

* * * * *